(12) United States Patent
Kitamura et al.

(10) Patent No.: US 6,828,622 B2
(45) Date of Patent: *Dec. 7, 2004

(54) NONVOLATILE SEMICONDUCTOR MEMORY DEVICE AND ITS MANUFACTURING METHOD

(75) Inventors: Shota Kitamura, Kawasaki (JP); Seiji Yamada, Shinagawa-Ku (JP)

(73) Assignee: Kabushiki Kaisha Toshiba, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/392,865

(22) Filed: Sep. 9, 1999

(65) Prior Publication Data

US 2002/0003253 A1 Jan. 10, 2002

(30) Foreign Application Priority Data

Sep. 9, 1998 (JP) .......................................... 10/255619

(51) Int. Cl.⁷ ............................................. H01L 29/788
(52) U.S. Cl. ...................... 257/316; 257/317; 257/321
(58) Field of Search .............................. 257/314–317, 257/321, 900; 438/257, 263

(56) References Cited

U.S. PATENT DOCUMENTS 5,068,697 A * 11/1991 Noda et al. ................. 257/315
5,384,272 A * 1/1995 Ibok et al. ................... 438/262
5,434,093 A * 7/1995 Chau et al. .................. 438/300
5,518,945 A * 5/1996 Bracchitta et al. .......... 438/307
5,652,449 A    7/1997 Shinagawa et al.
5,834,807 A * 11/1998 Kim ............................ 257/315
5,907,171 A * 5/1999 Santin et al. ................ 257/315
5,962,890 A * 10/1999 Sato ............................ 257/320
6,071,779 A * 6/2000 Mehrad et al. .............. 438/262

FOREIGN PATENT DOCUMENTS

JP          407161848      *  6/1995

OTHER PUBLICATIONS

Nitride Sidewall Sapcers Used As a Contamination Barrier, IBM Technicall Disclosure Bulletin (TDB–ACC–NO: NN8801295), Jan. 1988, US.*

* cited by examiner

Primary Examiner—Thien F Tran
(74) Attorney, Agent, or Firm—Hogan & Hartson, LLP

(57) ABSTRACT

Memory cells each having a floating gate (4), control gate (6), and source and drain diffusion layers (7a, 7b) are formed on a silicon substrate (1). A silicon nitride film (10) by low-pressure CVD is maintained as side wall insulating films on side walls of the gates in each memory cell. A silicon nitride film (11) by plasma CVD is formed to cover a memory cell array, and silicon oxide films (12a, 12b) are made on the silicon nitride film (11) to form an inter-layer insulating film. A common source line (13) connected to the source diffusion layer 7a is formed to embed in the silicon oxide film (12a), and a bit line (14) connected to the drain diffusion layer (7b) is formed on the silicon oxide film (12b).

2 Claims, 14 Drawing Sheets

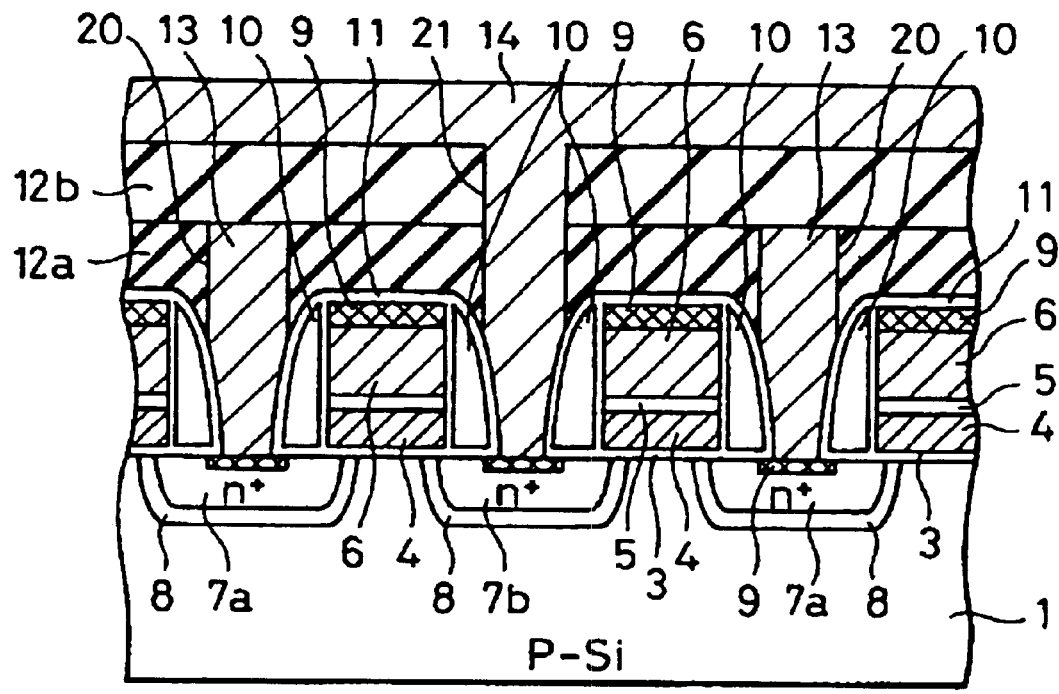
F I G. 2 (a)
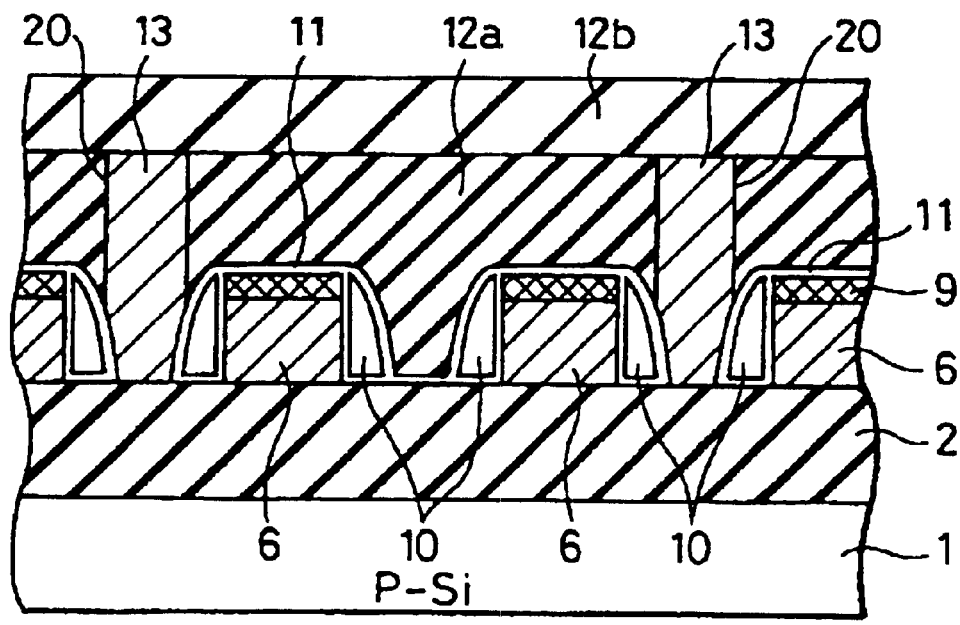
F I G. 2 (b)

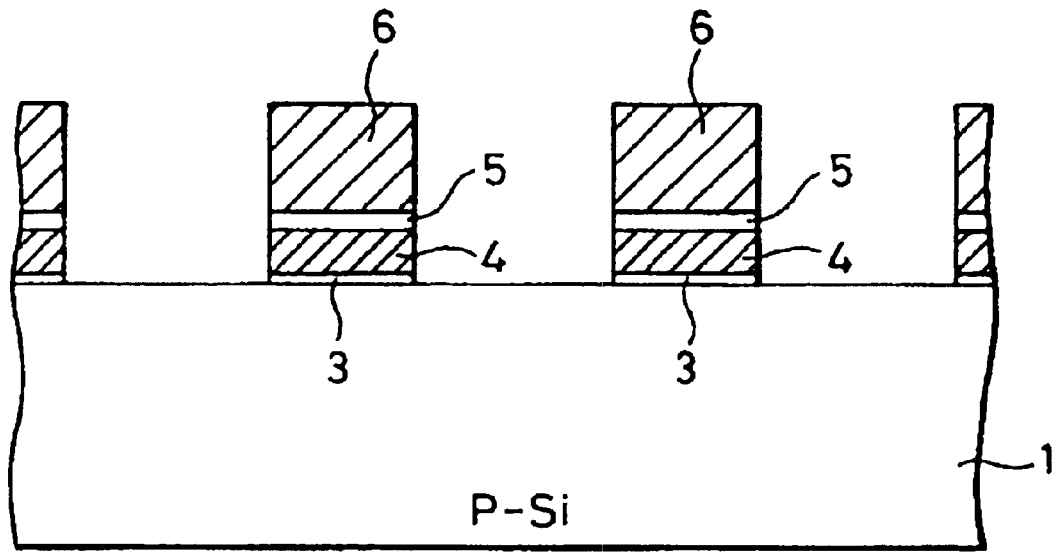
F I G. 4 (a)
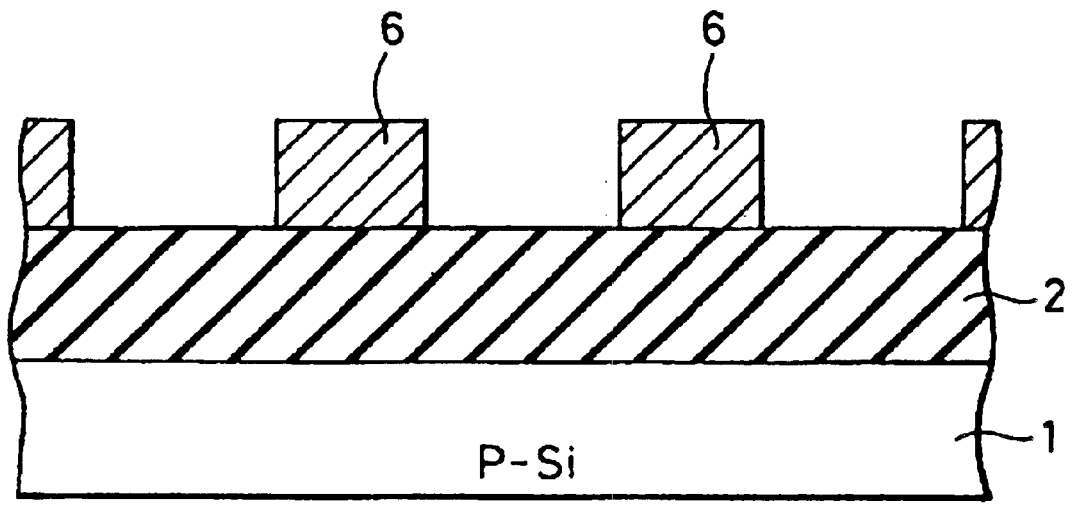
F I G. 4 (b)

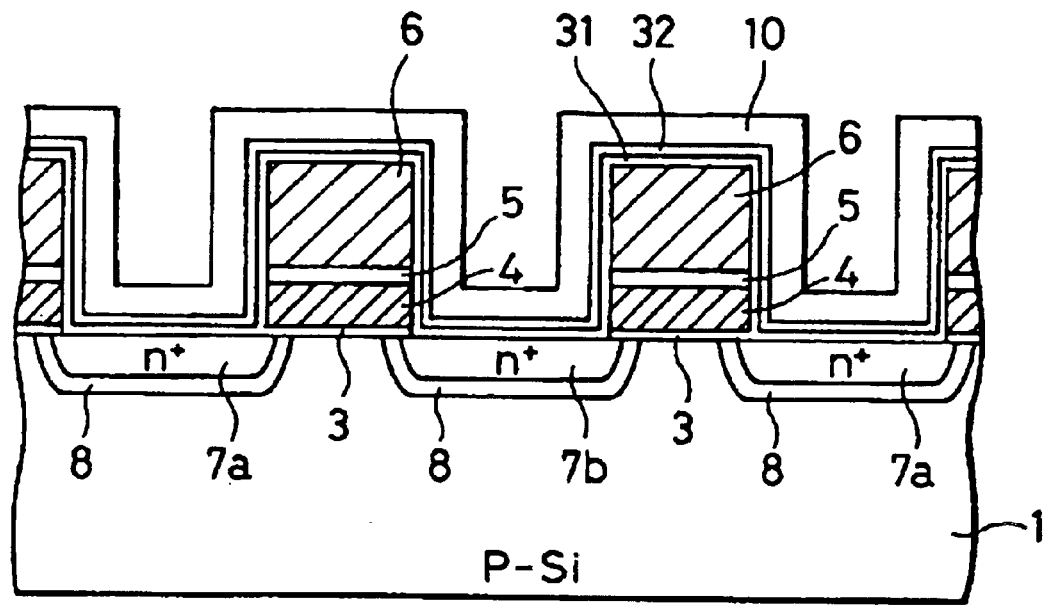
F I G. 6 (a)
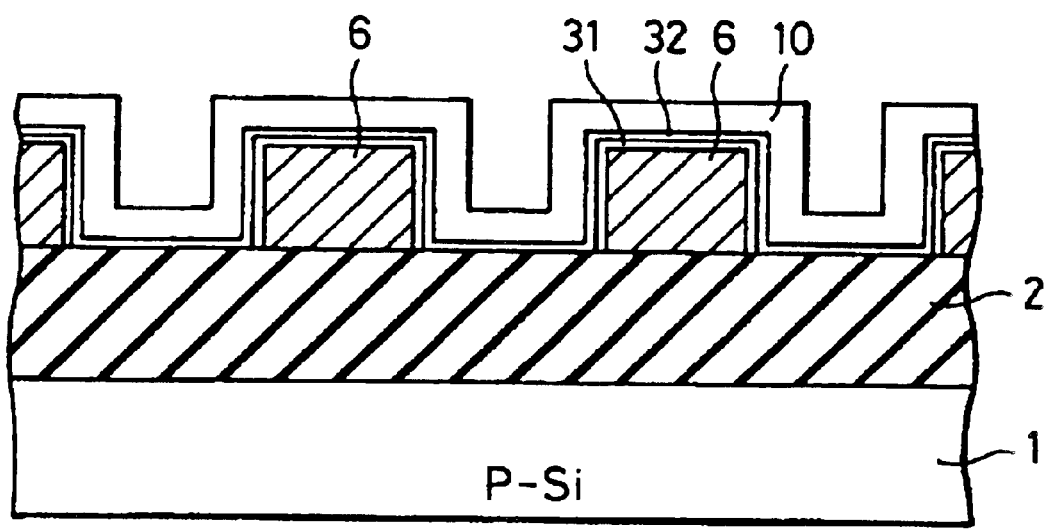
F I G. 6 (b)

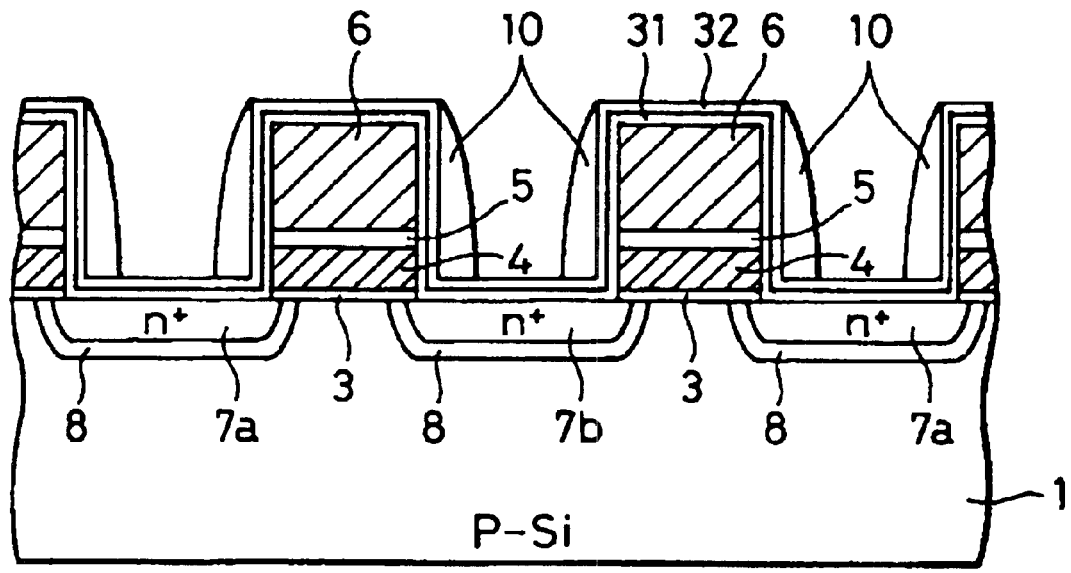
F I G. 7 (a)
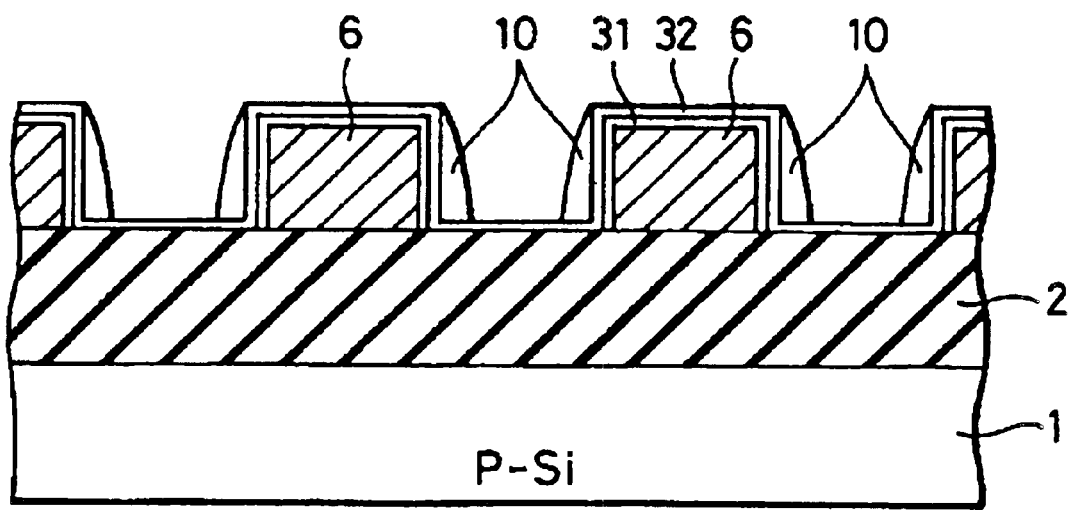
F I G. 7 (b)

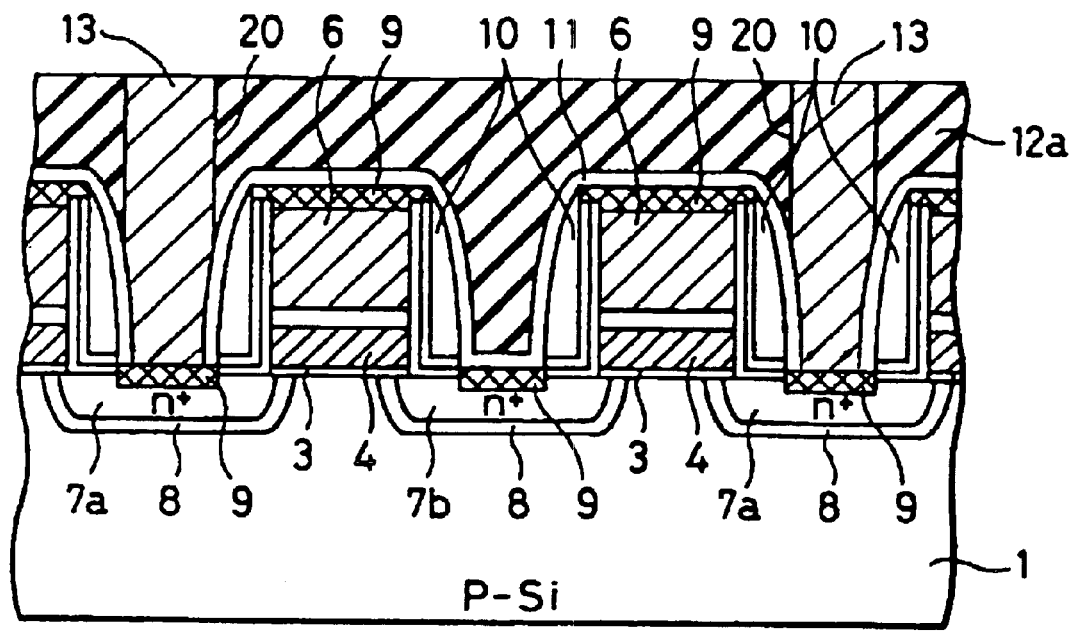
F I G. 1 0 (a)
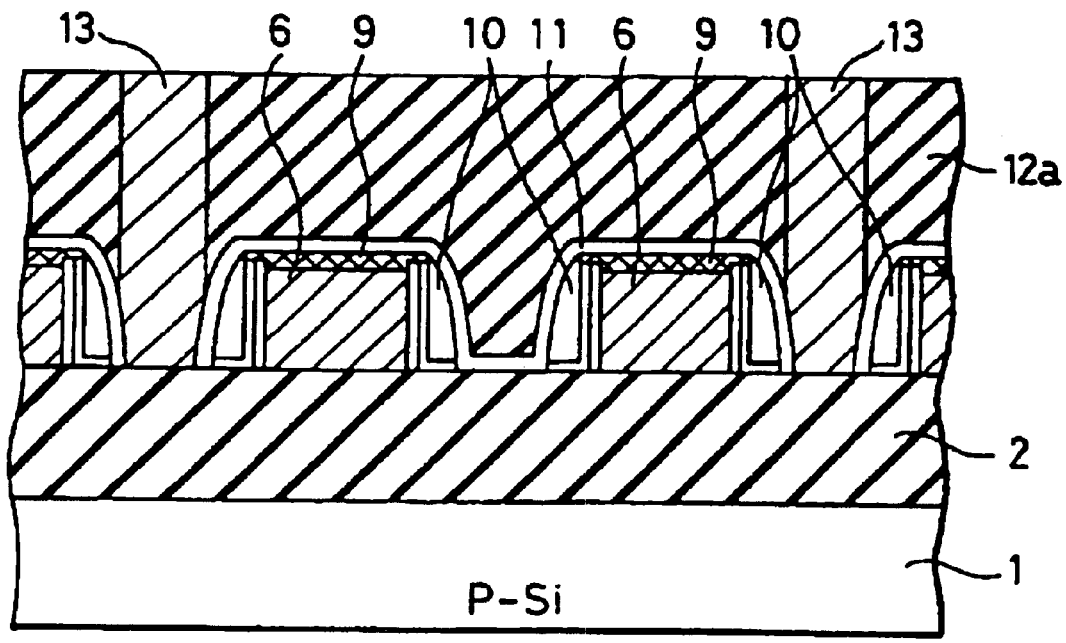
F I G. 1 0 (b)

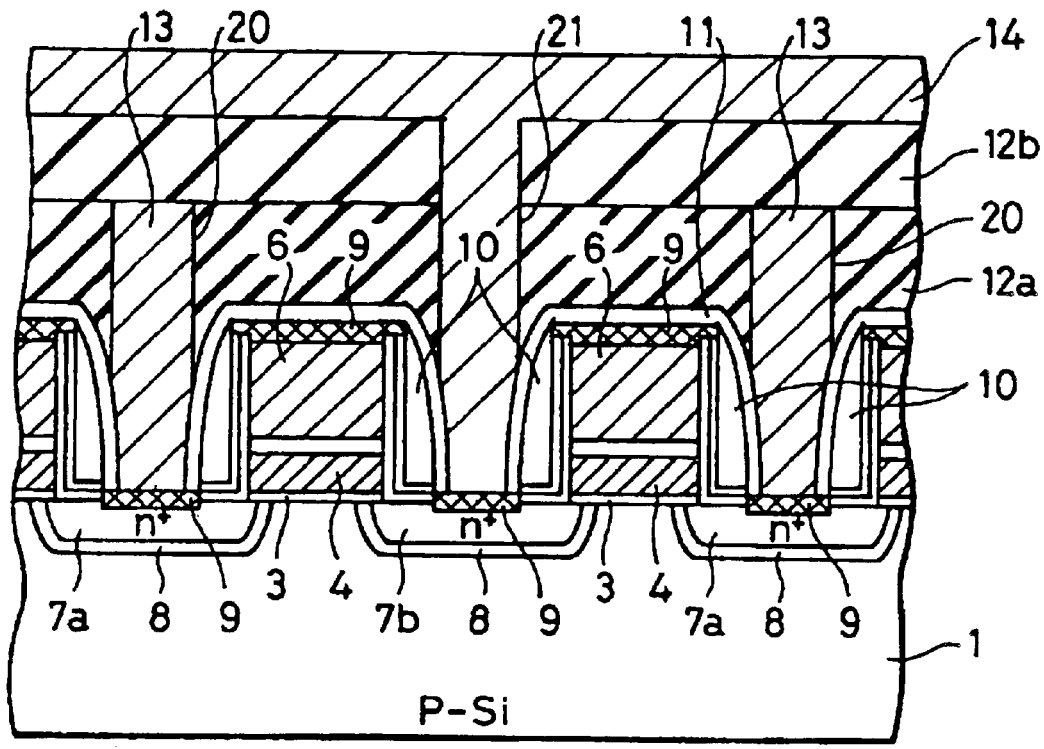
F I G. 1 1 (a)
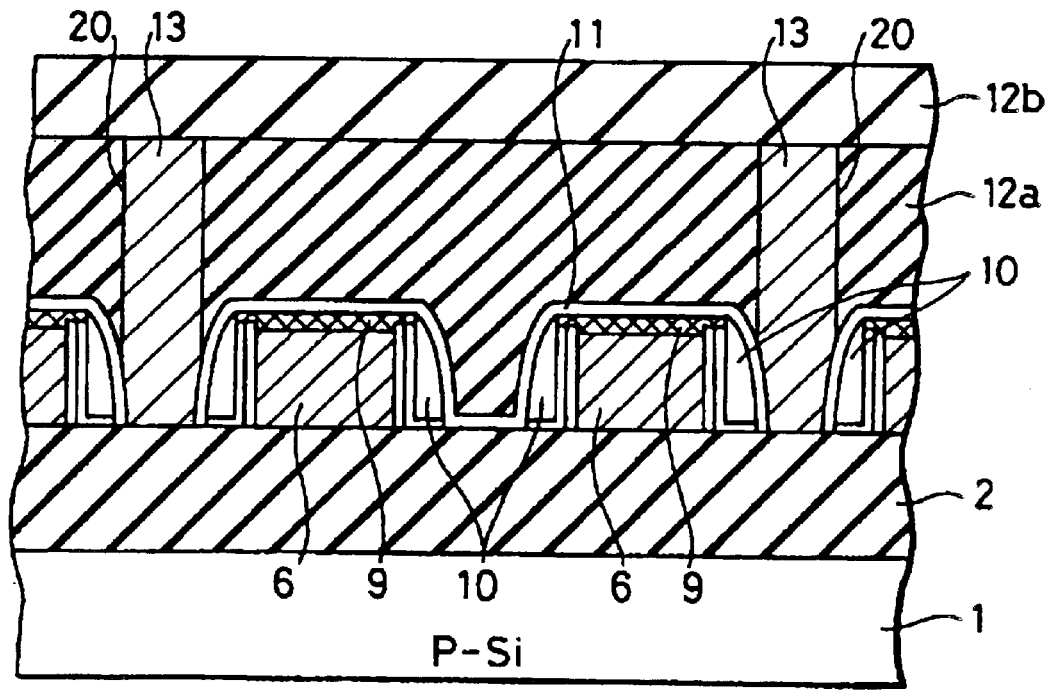
F I G. 1 1 (b)

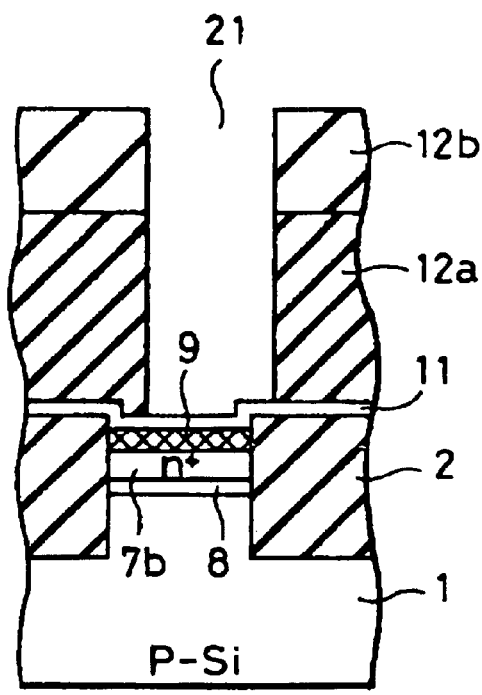
F I G. 1 3
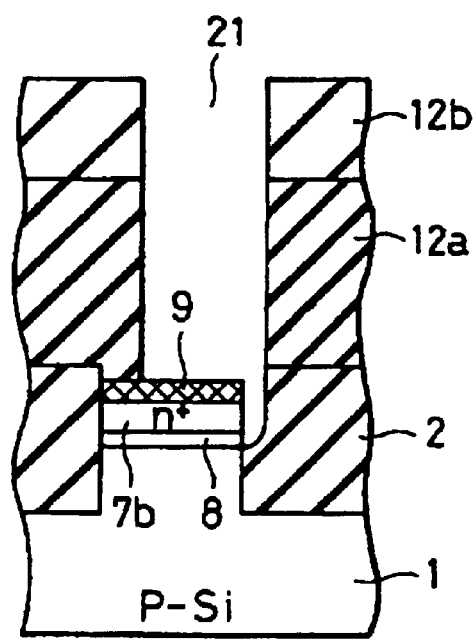
F I G. 1 4

NONVOLATILE SEMICONDUCTOR MEMORY DEVICE AND ITS MANUFACTURING METHOD

BACKGROUND OF THE INVENTION

1. Field of the Invention

This invention relates to a nonvolatile semiconductor memory device, such as EEPROM, and its manufacturing method.

2. Background Art

A nonvolatile semiconductor memory device is made of a plurality of memory transistors (memory cells) each having a gate, source and drain diffusion layers to perform nonvolatile storage of an electric charge in response to a data. Representative one of electrically rewritable EEPROM-type memory cells is introduced below. This is a MOS transistor including a floating gate made on a semiconductor substrate via a tunneling insulating film as a first gate insulating film, and a control gate stacked thereon via a second gate insulating film. Each floating gate is independently formed for each memory cell to function as a charge storage layer. The control gate is common to a plurality of memory cells to function as a word line.

From the viewpoint of connection of memory cells of EEPROM, there are the following two representative types of memory cells. One of them is NOR-type cells in which drains of a plurality of memory transistors are connected in parallel to a single bit line. The other is NAND-type cells in which adjacent ones of memory cells commonly share a source diffusion layer or a drain diffusion layer, then a plurality of transistors are connected in series, and the drain diffusion layer at one end thereof is connected to a bit line.

When integrating memory cells of EEPROM in a micro pitch, side wall insulating films (protective side walls) are selectively made on opposite side walls of the gate of each cell for the protective purpose. Typical side wall insulating film is a silicon oxide ($SiO_2$) film made by CVD. A substrate having memory cells thereon has formed wiring layers such as bit lines via one or more inter-layer insulating films. Typically used as the inter-layer insulating film is a silicon oxide film made by CVD. Since the inter-layer insulating film is thick, when contact holes, etc. are made, there is the need for increasing the processing margin while preventing excessive etching of the base layer.

Therefore, when a CVD silicon oxide film is used as the inter-layer insulating film, it is desirable to make a silicon nitride film on the base layer to behave as an etching stopper. In this case, the silicon nitride film results in preventing that the side-wall insulating films in form of silicon oxide films provided on opposite side walls of a memory cell are etched. As a result, in a memory cell array including memory cells in a micro pitch, micro contact can be made reliably.

There is a report, however, that memory cells deteriorate in reliability when using silicon oxide films as both side wall insulating films (protective side walls) and the inter-layer insulating film of each memory cell and forming a silicon nitride film as the base layer of the inter-layer insulating film. That is, while data reads are performed, some electrons are injected into floating gates of erased memory cells to vary threshold values thereof (read disturb). This is currently considered to be caused by the phenomenon that hydrogen generated during deposition of the silicon nitride film undesirably spreads into the gate insulating films (particularly, tunneling oxide film) of each memory cell.

In the case where a metal silicide film is selective formed on surfaces of the gate, source and drain diffusion layers for the purpose of reducing the resistance, a restriction is imposed to a subsequent high-temperature annealing process. Therefore, plasma CVD enabling deposition at a low temperature is preferably used to stack or deposit the silicon nitride film. However, a silicon nitride film obtained by plasma CVD is more liable to generate hydrogen than a silicon nitride film obtained by low-pressure CVD. Therefore, the above-indicated deterioration of memory cells in reliability is serious especially when the silicon nitride film is stacked or deposited by plasma CVD.

In the case where low-pressure CVD is used for stacking or depositing the silicon nitride film, deterioration of memory cells is less than those by plasma CVD. However, prevention of deterioration in reliability still remains unsatisfactory. A reason thereof is as set forth below. Silicon nitride films are dense films. Therefore, both of the side wall insulating films of a memory cell are made of silicon films, impurities contained in the silicon oxide films probably get to be confined in the memory cell area by the silicon nitride films. That is, impurities contained in the silicon oxide films on opposite side walls might lose their ways of escape and adversely behave to deteriorate the reliability of the memory cell.

SUMMARY OF THE INVENTION

It is therefore an object of the invention to provide a nonvolatile semiconductor memory device realizing a high reliability, and its manufacturing method.

According to the invention, there is provided a nonvolatile semiconductor memory device comprising:

a semiconductor substrate;

memory transistors formed on the semiconductor substrate to perform nonvolatile storage of an electric charge in accordance with data;

protective side walls in form of first silicon nitride films formed by low-pressure CVD and maintained on side walls of gates of each memory transistor;

a second silicon nitride film covering surfaces of the gate, surface of a source diffusion layer, surface of a drain diffusion layer and surfaces of the protective side walls of each memory transistor; and a wiring layer formed on the second silicon nitride film via an inter-layer insulating film containing silicon oxide as its major component.

According to the invention, there is further provided a method for manufacturing a nonvolatile semiconductor memory device comprising:

a first step of forming in a semiconductor substrate memory transistors for performing nonvolatile storage of an electric charge in accordance with data;

a second step of stacking a first silicon nitride film by low-pressure CVD to cover the memory transistors and selectively maintaining the first silicon nitride film as protective side walls on side walls of gates of each memory transistor;

a third step of stacking a second silicon nitride film to cover surfaces of gates, a surface of a source diffusion layer, a surface of a drain diffusion layer and the protective side walls; and a fourth step of forming a wiring layer above the second silicon nitride film via an inter-layer insulating film including a silicon oxide film as its major component.

The invention uses a dense first silicon nitride film made by low-pressure CVD, instead of a silicon oxide film, as side-wall protective films of each memory transistor. therefore, even when the second silicon nitride film is made by plasma CVD, diffusion of hydrogen, or the like, into the memory cell can be prevented, and the memory transistor can be reliably prevented from deteriorating in reliability.

In the silicon nitride film by low-pressure CVD, even if containing impurities, the movement of impurities is small as compared with silicon oxide films by low-pressure CVD. Therefore, even when the second silicon nitride film covers the memory transistor area, deterioration in reliability caused by impurities spreading from the side walls, i.e., the gate insulating film, is alleviated. Therefore, even when the second silicon nitride film is stacked by low-pressure CVD, deterioration in reliability can be alleviated as compared with the conventional type using silicon oxide films as side-wall insulating films.

Furthermore, according to the invention, since the second silicon nitride film covers the memory transistor area to form the inter-layer insulating film including the silicon oxide film as its major component, in the etching process for making contact holes, etc. in the inter-layer insulating film, the silicon nitride film as its base layer behaves as an etching stopper. Therefore, when the inter-layer insulating film is over-etched to make a processing margin, or there is a deviation in fitting a mask for making contact holes, useless etching of the underlying silicon substrate and the insulating film for separating devices can be prevented.

BRIEF DESCRIPTION OF THE DRAWINGS

FIGS. 2A and 2B are cross-sectional views taken along the A—A' line and B—B' line in FIG. 1;

FIGS. 4A and 4B are cross-sectional views corresponding to FIGS. 2A and 2B, showing different steps of a process for making gates of the same memory cell array;

FIGS. 6A and 6B are cross-sectional views similarly showing different steps of a process for stacking the first silicon nitride film;

FIGS. 7A and 7B are cross-sectional views similarly showing different steps of a process for maintaining the fist silicon nitride film as side wall insulating films (side walls);

FIGS. 10A and 10B are cross-sectional views similarly showing different steps of a process for burying a common source line in the silicon oxide film;

FIGS. 11a and 11B are cross-sectional views similarly showing different steps of a process for stacking a silicon oxide film as the second layer of the inter-layer insulating film to form a bit line;

FIG. 13 is a cross-sectional view taken along the D—D' line of FIG. 1, under the presence of an offset in bit line contact holes;

FIG. 14 is a cross-sectional view corresponding to FIG. 13 without the use of the silicon nitride film.

DETAILED DESCRIPTION OF THE PREFERRED EMBODIMENT

Explained below is an embodiment of the invention with reference to the drawings.

Figure 1:
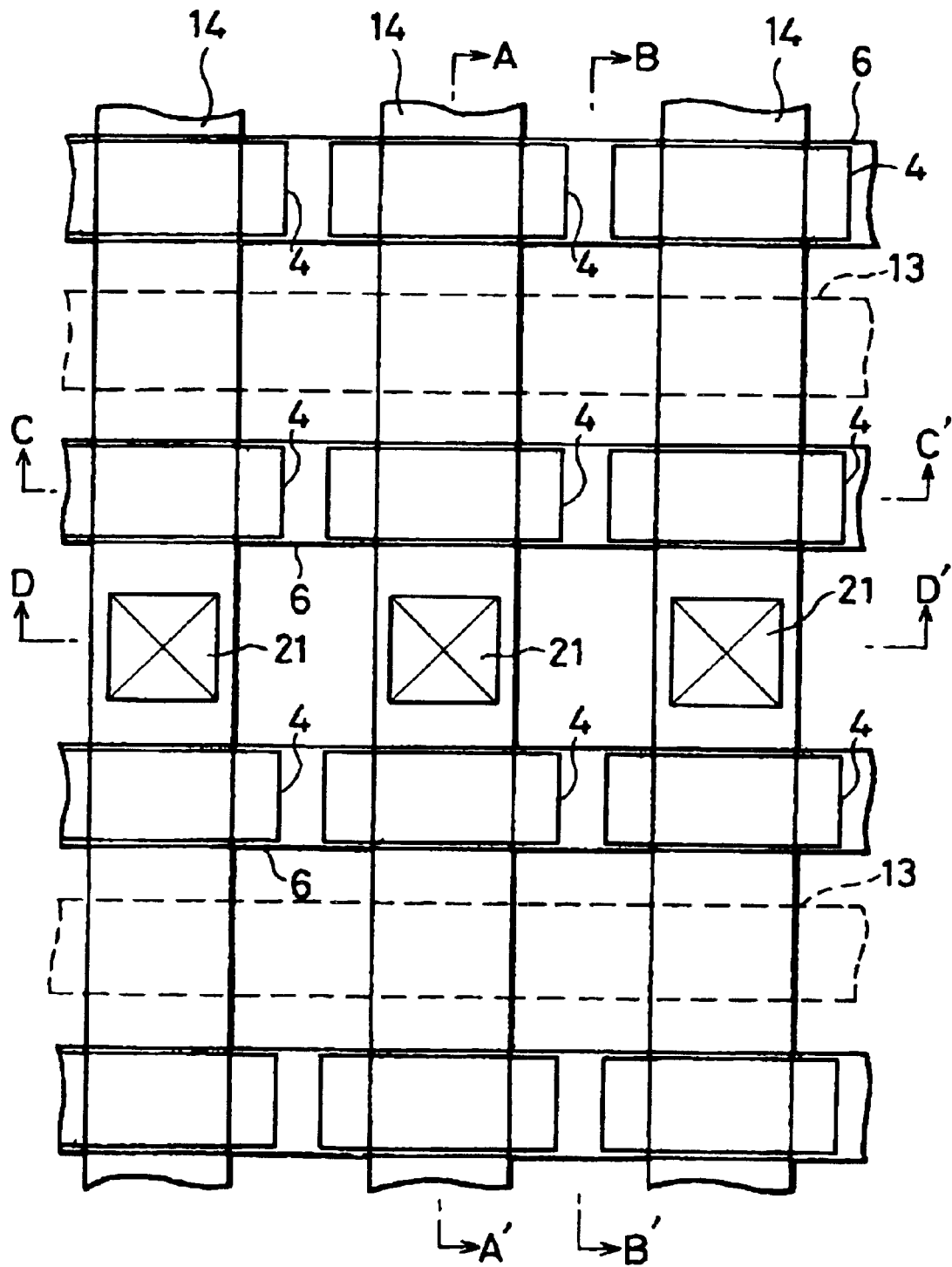
FIG. 1 is a layout of a memory cell array of EEPROM according to an embodiment of the invention.
Figure 3:
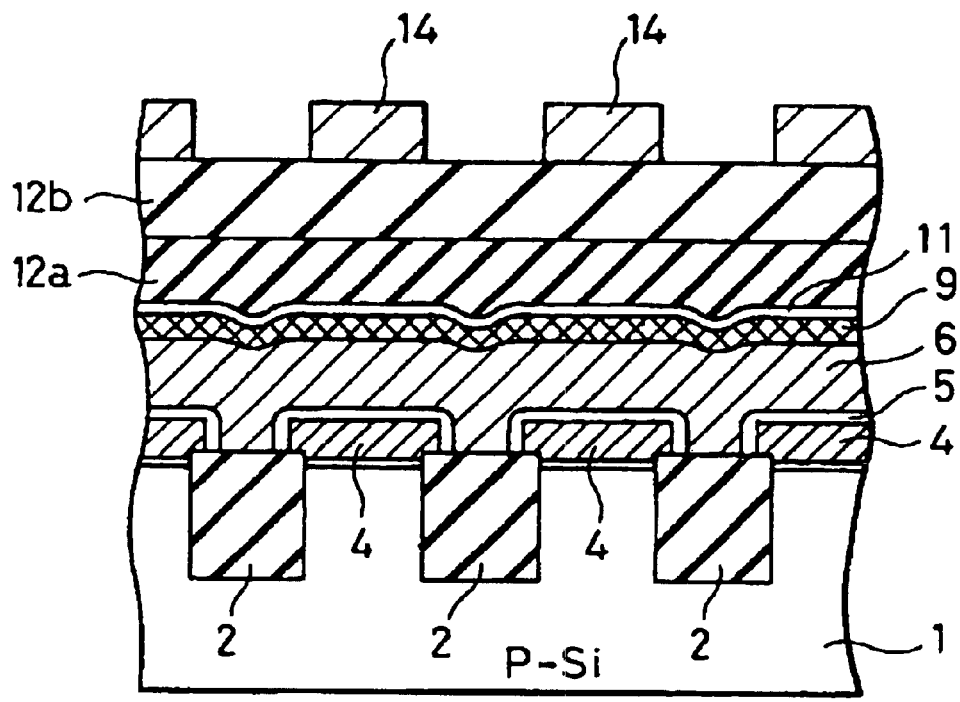
FIGS. 3A and 3B are cross-sectional views taken along the C—C' line and D—D' line of FIG. 1.
Figure 3:
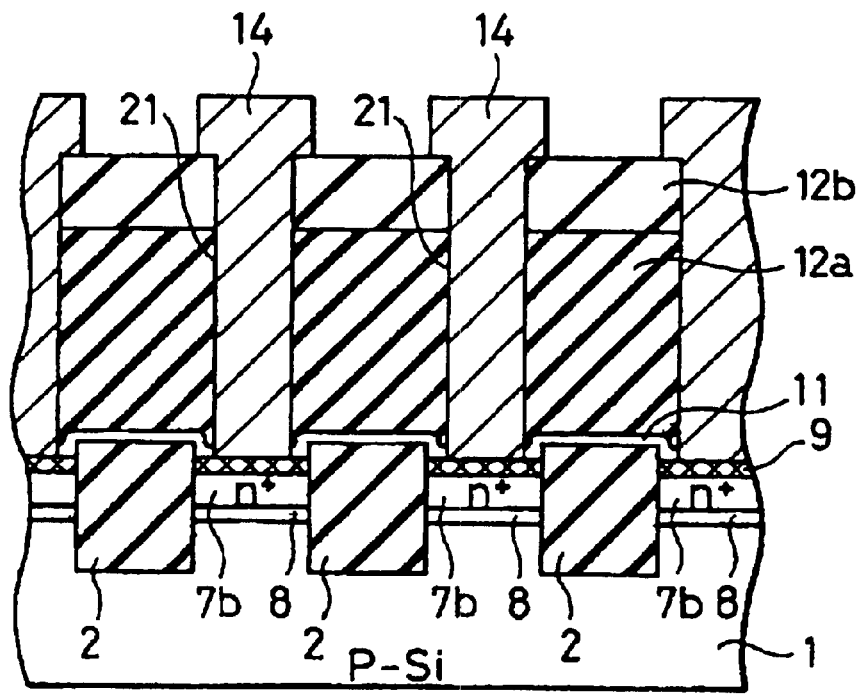
Figure 5:
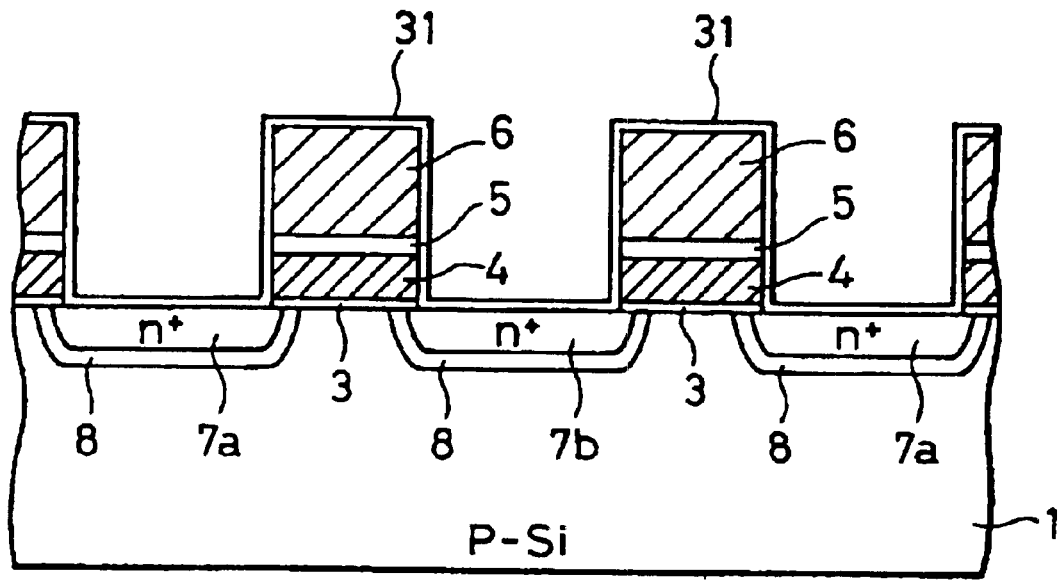
FIGS. 5A and 5B are cross-sectional views similarly showing different steps of a process for making source and drain diffusion layers.
Figure 5:
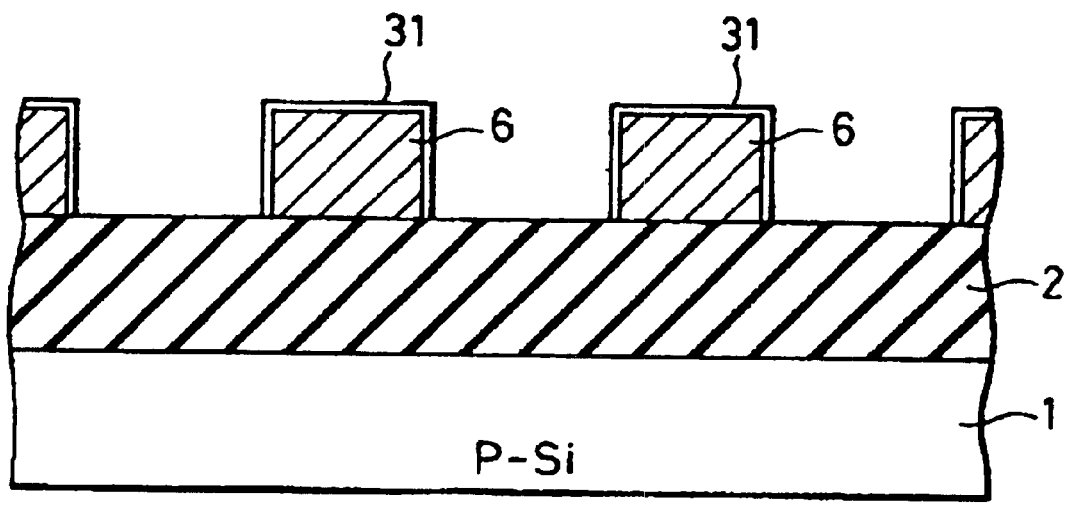
Figure 8:
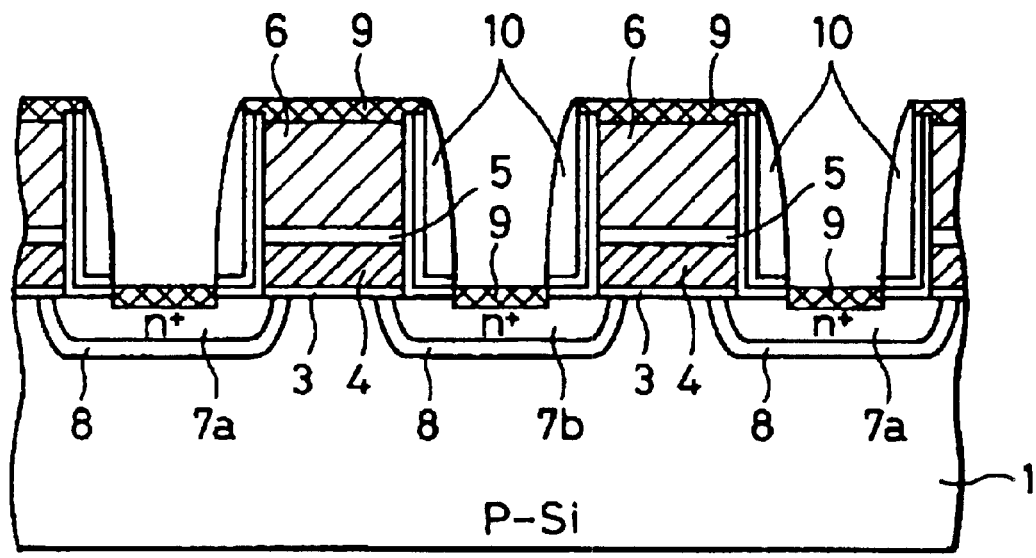
FIGS. 8A and 8B are cross-sectional views similarly showing different steps of a process for making a titanium silicide film in memory cells.
Figure 8:
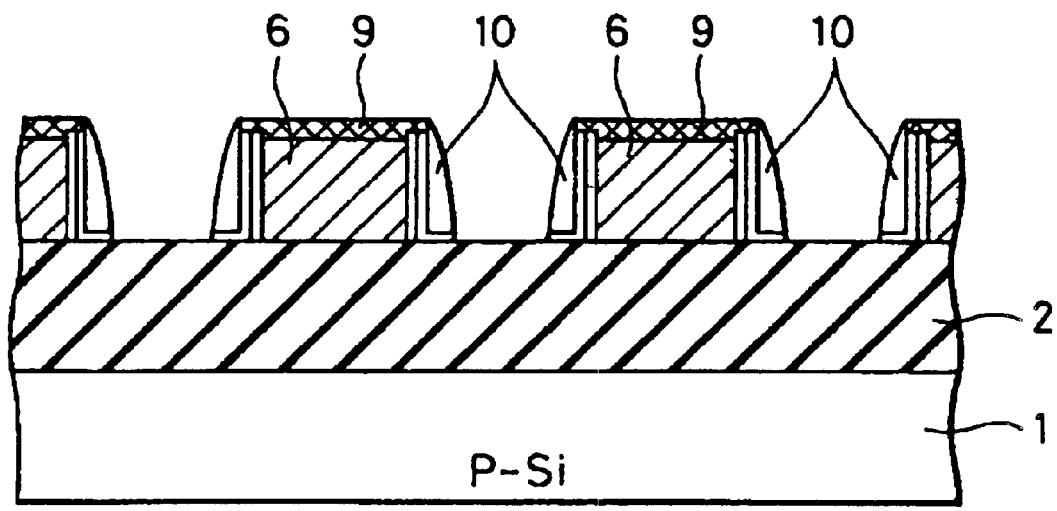
Figure 9:
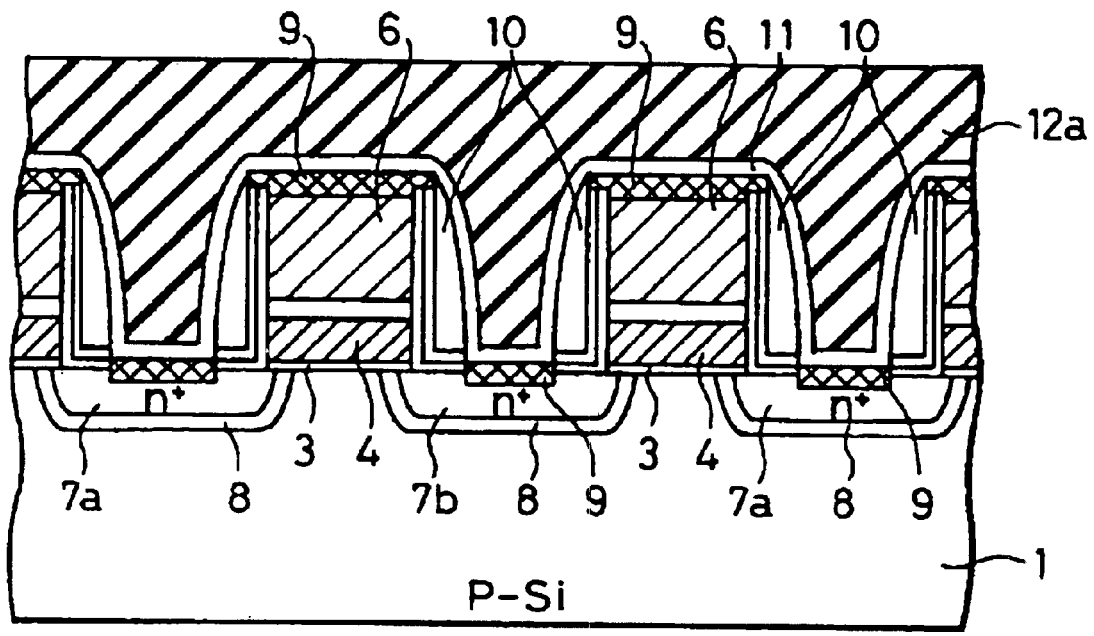
FIGS. 9A and 9B are cross-sectional views similarly showing different steps of a process for stacking a silicon oxide film as the fist layer of the inter-layer insulating film.
Figure 9:
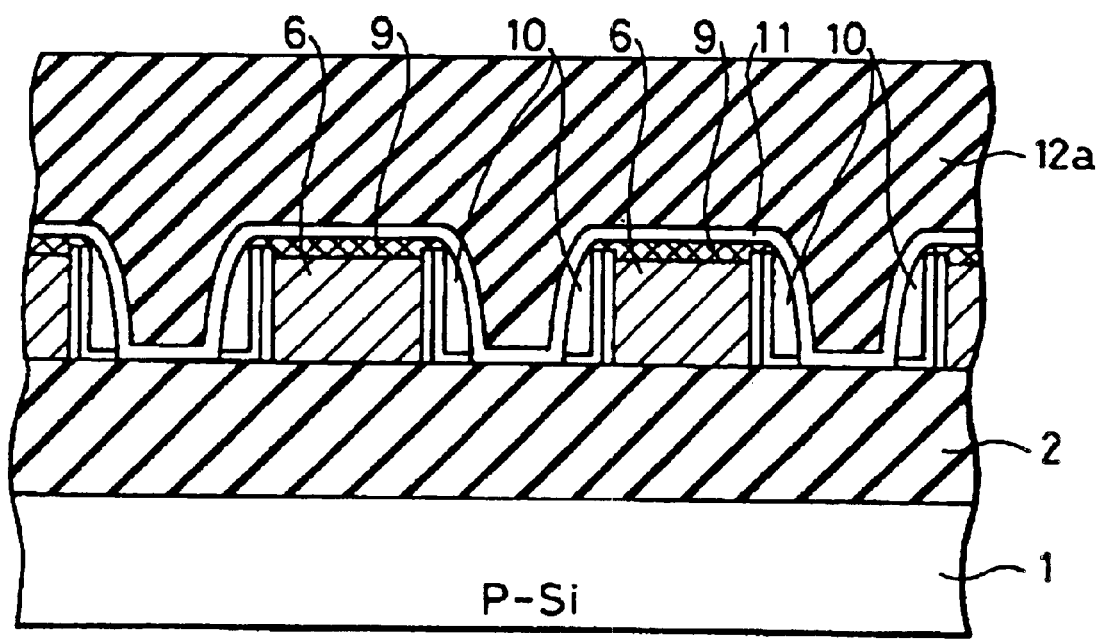

FIG. 1 shows a layout of a central area of a memory cell array having a NOR-type EEPROM structure according to an embodiment of the invention. FIGS. 2A and 2B are cross-sectional views taken along the A—A' line and B—B' line of FIG. 1. FIGS. 3A and 3B are cross-sectional views taken along the C—C' line and D—D' line of FIG. 1.

A memory transistor (memory cell) includes a floating gate 4 formed in a region of a p-type silicon substrate (or p-type well) 1 sandwiched by two device-separation insulating films 2, 2 via a first gate insulating film (tunneling oxide film) 3, and a control gate 6 formed on the floating gate 4 via a second gate insulating film 5. An $n^+$-type source diffusion layer 7a and a drain diffusion layer 7b are further provided in self alignment with the control gate 6.

The floating gate 4 is made of a first polycrystalline silicon film, and it is independently provided for each memory cell. Each control gate 6 is made of a second polycrystalline silicon film, and it transversely extends over a plurality of memory cells in an elongated pattern to form a word line. A separation groove between every two adjacent floating gates 4, 4 aligned along the word line is processed and formed before the second polycrystalline silicon film is formed to make the control gates 5, 6. In the direction along the bit line, the floating gates 4, 4 are separated by patterning the first polycrystalline silicon film simultaneously upon stacking the second polycrystalline silicon film and patterning the control gates 6, 6.

In the embodiment shown here, the $n^+$-type source and drain diffusion layers 7a and 7b are formed in a $p^-$-type layer 8 made simultaneously with these $n^+$-type source and drain diffusion layers 7a, 7b. On surfaces of the source and drain diffusion layers 7a, 7b and the control gate 6, a titanium silicide film 9 is formed to reduce the resistance.

On opposite side walls of the gates in each memory cell, first silicon nitride film 10 are formed by low-pressure CVD. Then, a second silicon nitride film 11 is formed to cover surfaces of the control gate 6, silicon nitride films 10 on the side walls, source and drain diffusion layers 7a and 7b. Further formed thereon is a silicon oxide film 12 (12a, 12b) by CVD as an inter-layer insulting film. The silicon oxide film 12 may be any film including a silicon oxide $SiO_2$ film as its major component. For example, a BSG film or a BPSG film is acceptable. The second silicon nitride film 11 is a nitride film by plasma CVD, in this embodiment.

The first-layer silicon oxide film 12a is smoothed along its surface, and wiring grooves 20, 20 are made therein. In these wiring grooves 20, common source lines 13, 13 are embedded for connection to the source diffusion layer 7a of the memory cell. Each common source line 13 extends in parallel to the control gate 6 (word line ) as shown by broken lines in FIG. 1 to work for a plurality of memory cells. Contact holes 21, 21 are made to pass through the first-layer and second-layer silicon oxide films 12a and 12b. Bit lines 14, 14 are made to extend across the word lines. The bit line 14 partly extend through the contact holes 21, 21 to get into contact with the drain diffusion layer 7b, 7b of the memory cells.

FIGS. 4A, 4B through FIGS. 10A and 10B are cross-sectional views corresponding to FIGS. 2a and 2B, showing different steps of a manufacturing process of the same memory cell array. Referring to these drawings, a specific manufacturing process is explained below.

As shown in FIGS. 4A and 4B, device-separation insulating films 2, 2 are formed in the silicon substrate 1. The device-separation insulating films 2, 2 are made by, for example, STI (shallow trench isolation) in which, after shallow trenches are made on the substrate 1, a silicon oxide film is stacked by CVD and then smoothed to be embedded therein. Alternatively, the device separation oxide films 2, 2 may be made by LOCOS.

After that, the floating gates 4, 4 are formed in respective device sites via the first gate insulating film 3 by processing the first-layer polycrystalline silicon film 12a. Furthermore, the control gates 6, 6 are formed therein via the second gate insulating films 5, 5 by processing the second-layer polycrystalline silicon film. In the first-layer polycrystalline silicon film, separation grooves are made in their device-separation regions by RIE. Thereafter, simultaneously with etching the second polycrystalline silicon film by RIE, the first polycrystalline silicon film is etched. As a result, each control gate 6 and each floating gate 4 can be patterned while matching their ends in the bit line direction with each other.

After that, as shown in FIGS. 5a and 5B, secondary oxidation is conducted to cover the control gate 6 and the exposed surface of the silicon substrate 1 with an oxide film 31 as thick as 10 nm approximately. The oxide film 31 behaves as a buffer during ion implantation. Thereafter, a p-type impurity and an n-type impurity are ion-implanted to form the $n^+$-type source and drain diffusion layers 7a, 7b surrounded by the $p^-$-type layer 8.

Subsequently, as shown in FIGS. 6A and 6B, a silicon oxide film 32 as thin as 20 nm is stacked or deposited by CVD using TEOS (tetraethyloxysilane) as a source material. Next, a silicon nitride film 10, 150 nm thick, approximately, is stacked by low-pressure CVD. The silicon oxide film 32 functions as a stopper mask during etching of the silicon nitride film 10. Thereafter, the silicon nitride film 10 is etched by RIE. As a result, as shown in FIGS. 7A and 7B, the silicon nitride film 10 is selectively maintained as protective side walls solely on side walls of both gates of each memory cell.

After that, using the silicon nitride film 10 as a mask, the silicon oxide films 32 and 31 are etched to expose surfaces of the control gate 6, and source drain diffusion layers 7a, 7b. Then, a titanium (Ti) film is deposited and annealed. As a result, as shown in FIGS. 8A and 8B, titanium silicide films 9, 9 are selectively formed on surfaces of the control gate 6 and source drain diffusion layers 7a, 7b. The titanium film not contributing to the chemical interaction is removed thereafter.

After that, as shown in FIGS. 9A and 9B, after the silicon nitride film 11 as thick as approximately 50 nm is stacked by plasma CVD, the first-layer silicon oxide film 12a as the inter-layer insulating film is stacked by low-pressure CVD. The silicon nitride film 11 is a base layer of the inter-layer insulating film. It contacts the surfaces of the control gate 6, source and drain diffusion layers 7a, 7b and silicon nitride films 10 as the side walls of each memory cell to cover the memory cell, and also covers the device separation regions. The surface of the silicon oxide film 12a is smoothed by CMP processing. Then, as shown in FIG. 10A and 10B, wiring grooves 20, 20 are formed in the silicon oxide film 12a by RIE. Each groove 20 is continuous over the source diffusion layers 7a, 7a. A common source line 13 is buried in each wiring groove 20.

When the silicon oxide film 12a is etched by RIE, the silicon nitride film 11 behaves as an etching stopper under a gas condition ensuring a large ratio in etching selectively relative to the silicon nitride film 11. Therefore, by conducting over-etching, the silicon oxide film 12 can be etched reliably. Although each wiring groove 20 is formed to also extend into the device separation region as shown in FIG. 10B, the silicon nitride film 1 behaves as a stopper also in the device separation region, and prevents the device separation insulating film 2 being etched undesirably. Additionally, even if a deviation exists in location of the mask for the wiring groove 20, the silicon nitride film 11 behaves as a mask, and prevents the device separation insulating film 2 from being etched uselessly. The silicon nitride film 11 exposed into the wiring groove 20 is removed later by RIE using a different gas, and each silicide film 9 on each source diffusion layer 7a is exposed accordingly.

Next, as shown in FIGS. 11A and 11B, the second-layer silicon oxide film 12b is stacked, contact holes 21, 21 are made by RIE, and bit lines 14, 14 to be connected to the drain diffusion layers 7b, 7b are made. Also in the RIE process of contact holes 21, 21 for bit lines, by employing the same conditions as used in the RIE process for making wiring grooves 20, 20 of common source lines, reliable etching is ensured by the silicon nitride film 11 behaving as a mask.

Figure 12:
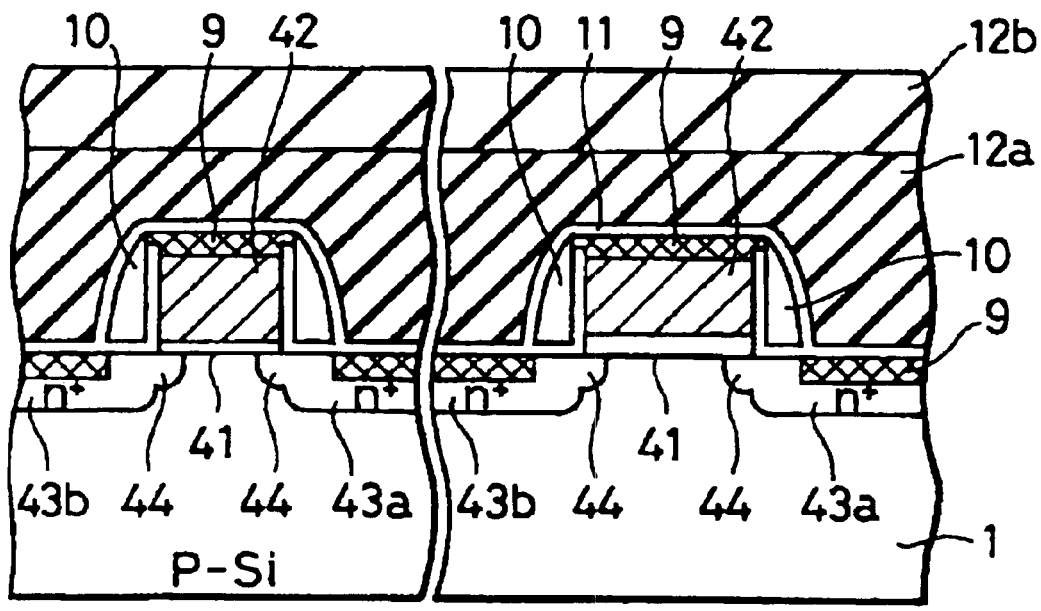
FIG. 12 is a cross-sectional view showing a structure of a MOS transistor as a peripheral circuit.

In the peripheral circuit area, at least one of a high-voltage MOS transistor supplied with a high write voltage, etc. and an ordinary low-voltage MOS transistor operative under a voltage below the source voltage VCC is formed. FIG. 12 shows a structure of the high-voltage MOS transistor and the low-voltage MOS transistor as the peripheral circuit. These MOS transistors as the peripheral circuit are made in a process separate from that of the memory cells.

A manufacturing process of the peripheral circuit MOS transistors is explained briefly. In the status shown in FIGS. 5a and 5B just after the gate, source and drain of the memory cell are made in the memory cell array area, the memory cell array area is masked, a gate electrode 4 is made in the peripheral circuit area via a gate insulating film 41, and ions are implanted to form the $n^+$-type source and drain diffusion layers 43a, 43b. More specifically, the source and drain diffusion layers 43a, 43b are formed as an LDD structure having low-concentrated $n^-$-type layers 44 at lateral ends of the channels.

After that, the silicon nitride film 10 as the side wall insulating films is stacked and etched, the silicon nitride film 11 is next stacked by plasma CVD, the inter-layer insulating film 12 is next stacked, the contact holes are made, and the wiring layer is formed. These steps are different from those of the memory cell array area.

In the embodiment shown here, since the silicon nitride film 11 is formed to underlie the silicon oxide film 12a as the inter-layer insulating film, useless etching is prevented in the etching step of the wiring grooves 20, 20 and the contact holes 21, 21. In a typical etching process, over-etching somewhat elongating the etching time is conducted, paying attention to leaving no residue of the material to be etched. In this embodiment, however, since the silicon nitride film 11 functions as a stopper, over-etching is employable, and the processing margin can be increased accordingly.

Additionally, even if resist masks for making the wiring grooves 20 and the contact holes 21 are positionally deviated or the size of the mask openings are somewhat large, the silicon nitride film 11 prevents the device separation insulating film 2 and others from being etched undesirably. This aspect is shown in FIG. 13, taking the case of the contact hole 21 for a bit line in a cross-sectional view taken along the D—D' line of FIG. 1 (that is, corresponding to the cross-sectional view of FIG. 3B). When the silicon nitride film 11 is not used, over-etching will result in etching the device separation insulating film 2 when the contact hole 21 overlaps the device separation insulating film 2 as shown in FIG. 14. This will cause the bit line to be short-circuited.

Moreover, according to the embodiment, by using the silicon nitride film 10 by low-pressure CVD as the side wall insulating film of the memory cell, instead of a silicon oxide film, even when the silicon nitride film is formed by plasma CVD neat the memory cell, the reliability of the memory cells does not deteriorate. This feature is explained more specifically by using data.

Figure 15:
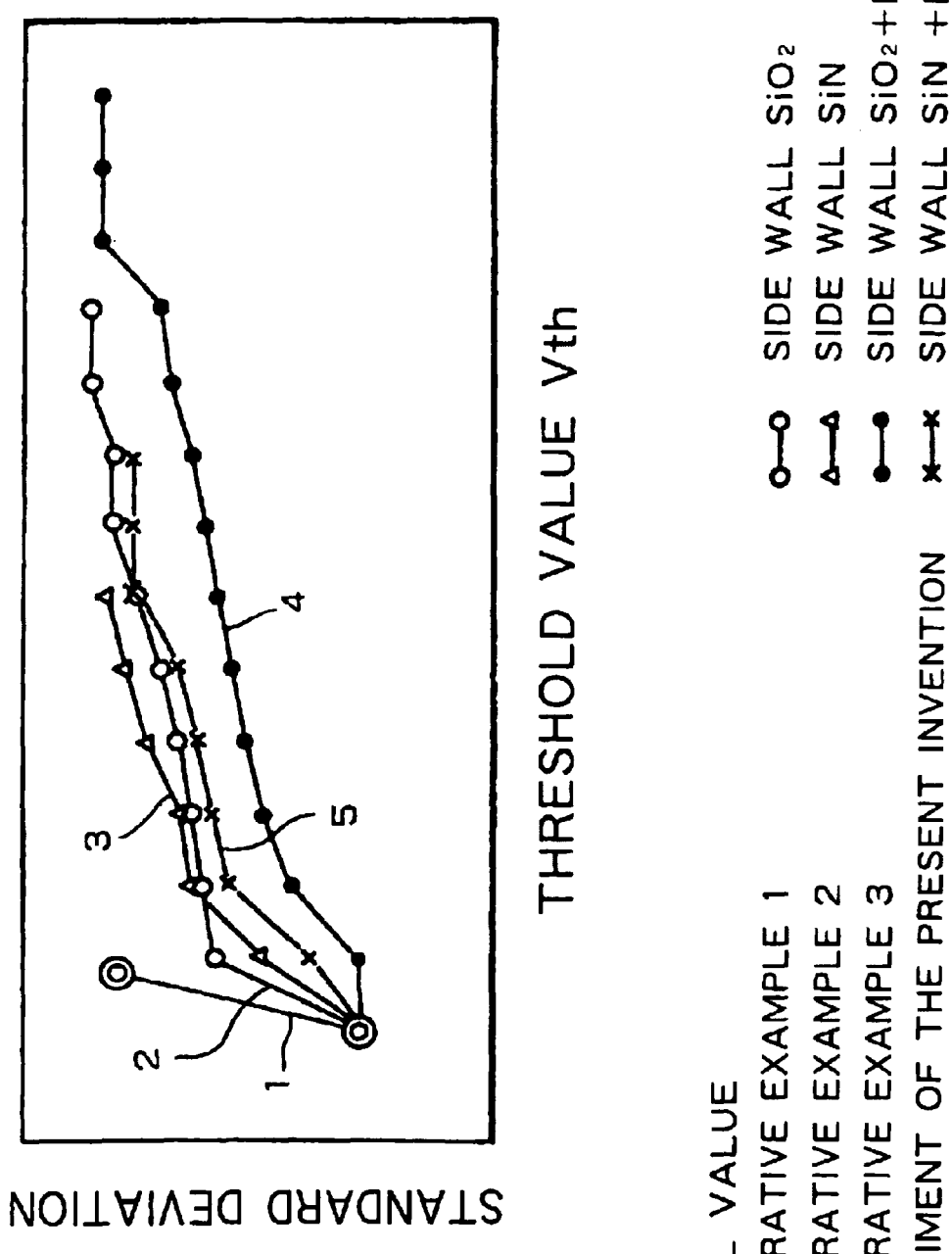
FIG. 15 is a diagram showing data of a reliability test of the memory cell according to the embodiment of the invention, together with those of comparative examples.

FIG. 15 shows statistical data of the number of bits causing threshold voltage Vth of each memory cell to shift upon data read operation after data write and erase operations are repeated over 10000 times in EEPROMs according to the embodiment and comparative examples 1 through 3. In FIG. 14, the abscissa is the threshold value Vth, and the shifting amount increases from the initial value toward the right end. The ordinate indicates a standard declination of the bits shifting the threshold values. Comparative Example 1 (plotted by white circles) uses a silicon oxide film as the sidewall insulating film and includes no silicon nitride film 11 by plasma CVD as used in the embodiment. Comparative Example 2 (plotted by triangles) uses a silicon nitride film by low-pressure CVD as the side wall insulating film, and includes no silicon nitride film 11 by plasma CVD as used in the embodiment.

Unlike these Comparative Examples 1 and 2, Comparative Example 3 (plotted by black points) uses a silicon oxide film as the side wall insulating film and uses a silicon nitride film 11 by plasma CVD like the embodiment. Comparative Example 3 exhibits a large shift amount of threshold value as compared with Comparative Examples 1 and 2 apparently as a result of the use of the silicon nitride film 11 by plasma CVD. On the other hand, in case of the embodiment (plotted by x) using the silicon nitride film 10 as the low-pressure CVD as the side wall insulating film and additionally providing the silicon nitride film 11 by CVD, no shift in threshold value caused by the use of the silicon nitride film 11 by plasma CVD is observed, and a high reliability on the same level as Comparative Examples 1 and 2 is confirmed.

In this embodiment, a main reason of stacking the second-layer silicon nitride film 11 by plasma CVD lies in that the titanium silicide film 9 is formed in the memory cell area and it restricts later high-temperature processes. Since plasma CVD enables deposition of films under a lower temperature than that of low-pressure CVD, the titanium silicide film 9 can be prevented from deterioration.

The invention, however, is still effective also when the second-layer silicon nitride film 11 is stacked by low-pressure CVD similarly to the first-layer silicon nitride film 10 used as the side wall insulating film. When the silicon nitride film 11 is stacked by low-pressure CVD, the film becomes dense, and results in confining impurities contained in the side wall insulating film. However, since the invention uses the silicon nitride film by low-pressure CVD as the side wall insulating film as well, movements of impurities in the film are small unlike the structure using a silicon oxide film, and the memory cell is less adversely affected by diffusion of impurities.

Furthermore, although the embodiment has been explained, taking NOR-type EEPROM as an example, the invention is similarly applicable to any other nonvolatile semiconductor memory devices such as NAND EEPROM, needless to say, and EPROM, mask ROM, and so forth.

As described above, according to the invention, since a first silicon nitride film by low-pressure CVD is used as each side wall protective film of a memory transistor, deterioration in reliability of the memory transistor is reliably prevented even when a second silicon nitride film is made later by plasma CVD.

Furthermore, since impurities do not move so much in the silicon nitride film by low-pressure CVD, even when the memory transistor area is covered by the second silicon nitride film, the reliability does not deteriorate so much due to impurity diffusion from side walls into the gate insulating film. Therefore, even when the second silicon nitride film is stacked by low-pressure CVD, deterioration in reliability is alleviated as compared with the conventional device using the silicon oxide film as the side wall insulating film.

Moreover, according to the invention, since the silicon nitride film is formed as the base layer of the inter-layer insulating film, the silicon nitride film behaves as an etching stopper in the etching process of the inter-layer insulating film for making contact holes, etc. Therefore, a large processing margin can be provided while preventing useless etching of the substrate and the device separation insulating film.

What is claimed is:

1. A nonvolatile semiconductor memory device comprising:

a semiconductor substrate;

shallow trench isolation layers which are strip shaped, extending in one direction, and embedded in a surface of said semiconductor substrate with predetermined intervals, a strip-shaped memory region being formed between two adjacent shallow trench isolation layers, and two adjacent memory regions being isolated by one of said shallow trench isolation layers;

memory transistors formed in each of said memory regions to perform nonvolatile storage of data, each memory transistor including:
a floating gate which is formed on said semiconductor substrate via a first gate insulating layer,
a control gate which is formed on said floating gate via a second gate insulating layer, and is strip-shaped, said control gate extending in another direction perpendicular to said one direction, and said control gate being common to said memory transistors, and
two source/drain diffusion layers formed on the surface of said semiconductor substrate;

sidewalls formed of a first silicon nitride layer, and covering both sides of said floating gate and said control gate of each of said memory transistors, said sidewalls being formed via an oxide layer serving as a stopper at the time of the etching for forming said sidewalls; and layers formed of a second silicon nitride layer each covering at least upper surfaces of said control gate and surfaces of said sidewalls of each of said transistors, said each layer being removed by etching so that the source/drain diffusion layers are exposed, wherein said nonvolatile semiconductor memory device, further comprising silicide layers formed on the surfaces of said control gate and said source/drain diffusion layers in each of said memory transistors, wherein in each of said memory transistors, one of the two source/drain diffusion layers is connected to a bit line via said silicide layer, and the other is connected to a common source line via said suicide layer, wherein said nonvolatile semiconductor memory device further comprises strip-shaped common source lines extending in said another direction, said each common source line being embedded in an interlayer insulation film between adjacent two of said control gates, the bottom surface of each said common source line being connected to said silicide layers which are formed on the surface of said others of said two source/drain diffusion layers and which are arranged in said another direction.

2. The nonvolatile semiconductor memory device according to claim 1, further comprising at least one of a low-voltage MOS transistor and a high-voltage MOS transistor formed as a periphery circuit.

* * * * *